United States Patent
Liao

(10) Patent No.: US 9,202,939 B2
(45) Date of Patent: Dec. 1, 2015

(54) SCHOTTKY DIODE AND METHOD FOR FABRICATING THE SAME

(71) Applicant: UNITED MICROELECTRONICS CORP., Hsin-Chu (TW)

(72) Inventor: Wei-Shan Liao, Yunlin County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/177,231

(22) Filed: Feb. 11, 2014

(65) Prior Publication Data

US 2015/0228808 A1  Aug. 13, 2015

(51) Int. Cl.
| | |
|---|---|
| H01L 29/66 | (2006.01) |
| H01L 21/00 | (2006.01) |
| H01L 29/872 | (2006.01) |
| H01L 29/45 | (2006.01) |
| H01L 29/06 | (2006.01) |
| H01L 21/324 | (2006.01) |
| H01L 21/283 | (2006.01) |

(52) U.S. Cl.
CPC ............ *H01L 29/872* (2013.01); *H01L 21/283* (2013.01); *H01L 21/324* (2013.01); *H01L 29/06* (2013.01); *H01L 29/0619* (2013.01); *H01L 29/45* (2013.01); *H01L 29/66143* (2013.01)

(58) Field of Classification Search
USPC .................... 438/140, 91, 92, 534, 570, 571, 438/FOR. 335; 257/484, E27.04, 570, 571, 257/54, 155, 280, 281, 452–454, 471–473, 257/E29.013, E29.271, E29.338
See application file for complete search history.

(56) References Cited

U.S. PATENT DOCUMENTS

| | | | |
|---|---|---|---|
| 8,421,181 B2 | 4/2013 | Anderson et al. | |
| 2010/0025693 A1* | 2/2010 | Malhan et al. | 257/76 |
| 2010/0252880 A1* | 10/2010 | Stribley | 257/335 |
| 2013/0277791 A1* | 10/2013 | Nassar et al. | 257/484 |

OTHER PUBLICATIONS

IBM Technical Disclosure Bulletin, vol. 18, page No. 731; Aug. 1975.*

* cited by examiner

*Primary Examiner* — Jasmine Clark
(74) *Attorney, Agent, or Firm* — Winston Hsu; Scott Margo

(57) ABSTRACT

A Schottky diode is disclosed. The Schottky diode includes: a substrate, a first-type buried layer in the substrate, a cathode region, an anode region surrounding the cathode region, and a first-type guard ring surrounding the anode region and connected to the first-type buried layer. The cathode region preferably includes a high-voltage second-type lightly doped drain in the substrate, a first-type well surrounding the high-voltage second-type lightly doped drain, and a first-type doping region in the first-type well and surrounding the high-voltage second-type lightly doped drain.

20 Claims, 4 Drawing Sheets

SCHOTTKY DIODE AND METHOD FOR FABRICATING THE SAME

BACKGROUND OF THE INVENTION

1. Field of the Invention

The invention relates to a Schottky diode and fabrication method thereof.

2. Description of the Prior Art

A Schottky diode is an electronic component that can be used in high frequency, fast switching or other electronic circuits, for example, as a RF mixer or detector diode, a power rectifier, or a clamp diode. The Schottky diode can exploit a rectifying barrier at a metal-semiconductor interface (i.e., the mismatch in the energy position of the majority carrier band edge of a semiconductor and the metal Fermi level across a metal-semiconductor interface) for its operation. Conduction in the Schottky diode is controlled by thermionic emission of majority carriers over the barrier. The Schottky diode can thus be a majority carrier device with a switching speed which is not limited by minority carrier effects.

A Schottky diode may be fabricated as a discrete component or incorporated in an integrated semiconductor circuit. A typical Schottky diode structure can include a metal or metal silicide conductive layer in rectifying contact with a semiconducting layer. The utilization of metal silicide however is expensive and in most circumstances increases the overall fabrication cost substantially.

In addition, in conventional Schottky diode structures, the edge of the Schottky contact layer is placed on a field relief guard ring (i.e. a diffused oppositely-doped semiconductor region). The guard ring, while capable of improving reverse breakdown characteristics of the Schottky diode, can also introduce a parasitic bipolar junction transistor in the structure. The parasitic bipolar junction transistor in action or active state can amplify small emitter-base currents to produce relatively large substrate currents to degrade the forward characteristics of the Schottky diode.

SUMMARY OF THE INVENTION

It is therefore an objective of the present invention to provide a Schottky diode for resolving the aforementioned issues.

According to a preferred embodiment of the present invention, a Schottky diode is disclosed. The Schottky diode includes: a substrate, a first-type buried layer in the substrate, a cathode region, an anode region surrounding the cathode region, and a first-type guard ring surrounding the anode region and connected to the first-type buried layer. The cathode region preferably includes a high-voltage second-type lightly doped drain in the substrate, a first-type well surrounding the high-voltage second-type lightly doped drain; and a first-type doping region in the first-type well and surrounding the high-voltage second-type lightly doped drain.

According to another aspect of the present invention, a method for fabricating Schottky diode is disclosed. The method includes the steps of: providing a substrate; forming a first-type buried layer in the substrate; forming a first-type guard ring in the substrate, wherein the first-type guard ring contacts the first-type buried layer; forming a cathode region in the substrate, and forming an anode region between the cathode region and the first-type guard ring. Preferably, the cathode region includes a high-voltage second-type lightly doped drain in the substrate, a first-type well surrounding the high-voltage second-type lightly doped drain, and a first-type doping region in the first-type well surrounding the high-voltage second-type lightly doped drain.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
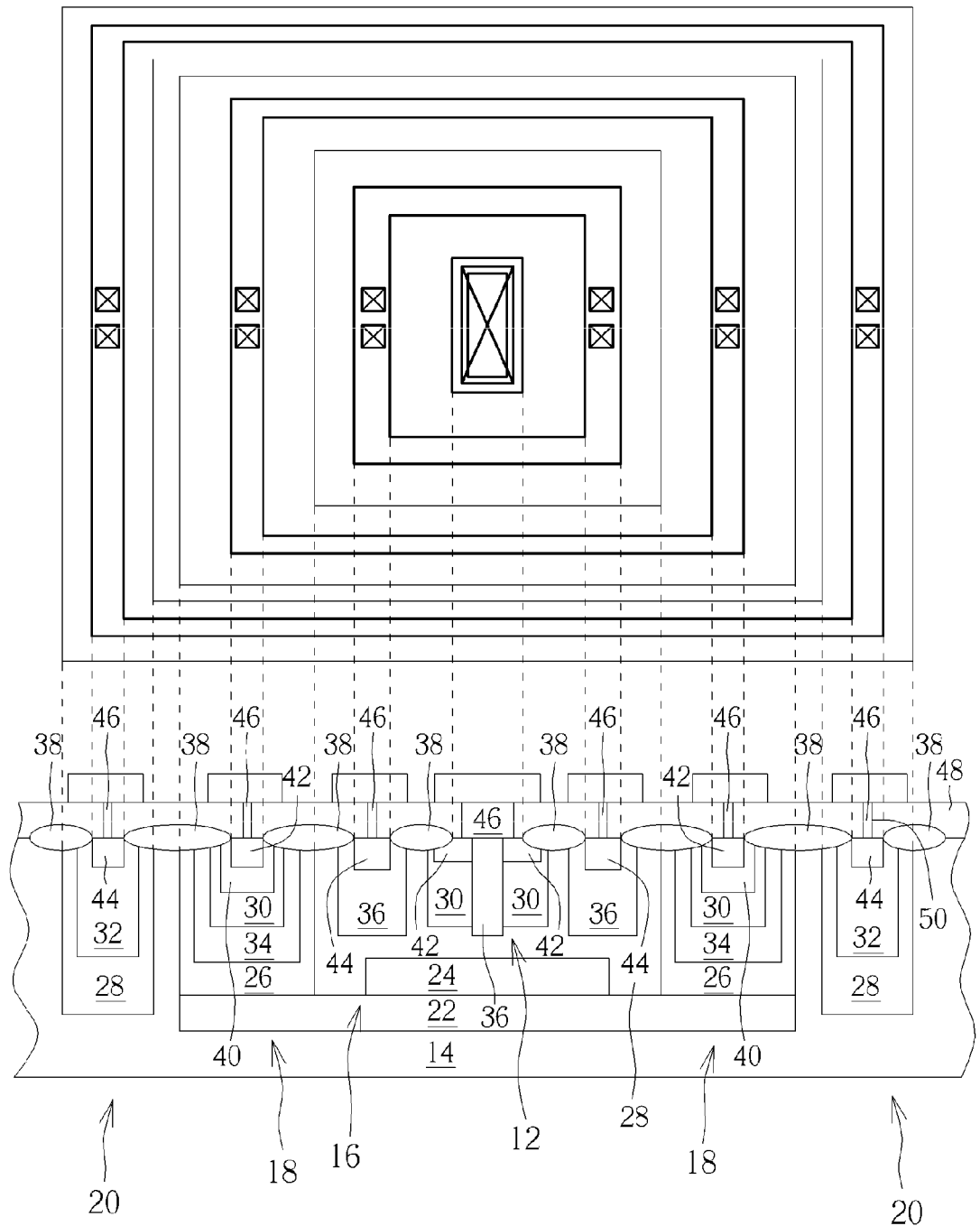
FIG. 1 illustrates a cross section view and corresponding top view of a Schottky diode according to a preferred embodiment of the present invention.

Referring to FIG. 1, FIG. 1 illustrates a cross section view and corresponding top view of a Schottky diode according to a preferred embodiment of the present invention. As shown in the top view portion of FIG. 1, the Schottky diode preferably includes a cathode region 12 positioned in the center of a substrate 14, an anode region 16, an n-type guard ring 18, and a p-type guard ring 20.

Each of the cathode region 12, the anode region 16, and the guard rings 18 and 20 is constituted by a plurality of doping regions, in which the formation of these doping regions may be accomplished by numerous approaches. According to a preferred embodiment of the present invention for fabricating the Schottky diode shown in FIG. 1, a substrate 14 is first provided, in which the substrate 14 may be a p-type substrate, but not limited thereto. An n-type buried layer (NBL) 22 is then formed in the substrate 14, and after conducting a thermal drive-in process, a p-type buried layer (PBL) 24 is formed above and contact the NBL 22, and a p-type epitaxial layer (not shown) is formed on the substrate 14.

Next, a high-voltage deep n-well (HVDNW) 26 is formed in the n-type guard ring 18 of the substrate 14, a plurality of high-voltage p-wells (HVPW) 28 is formed in the cathode region 12, anode region 16, and p-type guard ring 20, and a thermal drive-in is carried out thereafter. The HVPW 28 in the p-type guard ring 20 preferably not contact the adjacent HVDNW 26 of the n-type guard ring 18, whereas the HVPW 28 in the cathode region 12 and anode region 16 does contact the adjacent HVDNW 26.

Next, a plurality of n-wells 30 is formed in the cathode region 12 and n-type guard ring 18, a p-well 32 is formed in the p-type guard ring 20, and a diffusion is completed thereafter to define the active regions of the device.

Next, a high-voltage n-type lightly doped drain (HV-NLDD) 34 is formed in the n-type guard ring 18, a high-voltage p-type lightly doped drain (HV-PLDD) 36 is formed in both the cathode region 12 and the anode region 16, and a plurality of isolation structures 38 are then formed near the surface of the substrate 14 between the cathode region 12 and the anode region 16, between the anode region 16 and the n-type guard ring 18, and between the n-type guard ring 18 and the p-type guard ring 20. According to a preferred embodiment of the present invention, the isolation structures 38 could be composed of field oxides, but not limited thereto, in which the formation of the field oxides may be accomplished by carrying out a local oxidation of silicon (LOCOS) process, but not limited thereto. A thermal drive-in could be carried out thereafter.

Next, an n-type lightly doped drain (NLDD) 40 is formed in the n-type guard ring 18, a plurality of n-type doping regions such as an n+ regions 42 are formed in the cathode region 12 and the n-type guard ring 18, and a plurality of p-type doping regions such as a p+ regions 44 are formed in the anode region 16 and the p-type guard ring 20. This completes the fabrication of doping regions in the substrate 14. It should be noted that the types of semiconductor material, such as the n-type and p-type of all the doping regions disclosed in the aforementioned embodiment and embodiments below could be switched according to the demand of the process or product, which is also within the scope of the present invention.

After the doping regions are formed, a plurality of contact plugs 46 is formed to directly contact the HV-PLDD 36 of the cathode region 12, p+ regions 44, and n+ regions 42. The formation of the contact plugs 46 may be accomplished by first depositing a dielectric layer 48 on the substrate 14 and then forming a plurality of openings 50 in the dielectric layer 48 to expose the HV-PLDD 36 of the cathode region 12, p+ regions 44, and n+ regions 42. A first metal layer preferably selected from a material consisting of Ti and TiN is then sputtered in the opening 50, and a rapid thermal anneal process is performed thereafter. After depositing a second metal layer consisting of TiN and a third metal layer consisting of Tungsten (W) in the opening, a planarizing process such as a chemical mechanical polishing process is conducted to form a plurality of contact plugs 46 contacting the HV-PLDD 36, p+ regions 44, and n+ regions 42.

In addition to the preferred flow of fabrication as disclosed above, another fabrication flow involving the formation of the cathode region 12, anode region 16, and guard rings 18 and 20 is explained below. First, a substrate 14 is provided, in which the substrate 14 may be a p-type substrate, but not limited thereto. Next, an n-type buried layer (NBL) 22 is formed in the substrate 14, and after conducting a thermal drive-in process, a p-type buried layer (PBL) 24 is formed above the NBL 22. A p-type epitaxial layer (not shown) may be formed on the substrate 14 thereafter.

Next, an n-type guard ring 18 is formed in the substrate 14 to contact the NBL 22 directly. The formation of the n-type guard ring 18 may be accomplished by forming a HVDNW 26, forming a HV-NLDD 34 in the HVDNW 26, forming an n-well 30 in the HV-NLDD 34, forming an NLDD 40 in the n-well 30 of the n-type guard ring 18, and then forming an n+ region 42 in the NLDD 40, but not limited thereto.

After forming the n-type guard ring 18, a cathode region 12 is formed in the substrate 14. The formation of the cathode region 12 may be accomplished by forming a HV-PLDD 36 in a HVPW 28, forming an n-well 30 surrounding the HV-PLDD 36, and then forming an n+ region 42 in the n-well 30 surrounding the HV-PLDD 36.

After the cathode region 12 is formed, an anode region 16 is formed between the cathode region 12 and the n-type guard ring 18. The formation of the anode region 16 may be accomplished by first forming a HV-PLDD 36 in the HVPW 28, and then forming a p+ region 44 in the HV-PLDD 36.

A p-type guard ring 20 could be formed outside the n-type guard ring 18 thereafter, in which the formation of the p-type guard ring 20 may be accomplished by first forming a HVPW 28 in the substrate 14, forming a p-well 32 in the HVPW 28, and then forming a p+ region 44 in the p-well 32, but not limited thereto.

Similar to the aforementioned embodiment, a plurality of isolation structures 38 such as field oxides could be formed near the surface of the substrate 14 between the cathode region 12 and the anode region 16, between the anode region 16 and the n-type guard ring 18, and between the n-type guard ring 18 and the p-type guard ring 20, and a plurality of contact plugs 46 directly contacting the HV-PLDD 36 of the cathode region 12, the p+ regions 44 of the anode region 16 and the p-type guard ring 20, and the n+ regions 42 of the cathode region 12 and the n-type guard ring 18 could also be formed thereafter. As the steps for forming these elements are disclosed in the aforementioned embodiment, the details of which are omitted herein for the sake of brevity.

According to an embodiment of the present invention, a Schottky diode structure is further disclosed according to the aforementioned fabrication process. As shown in FIG. 1, the Schottky diode preferably includes a substrate 14, an n-type buried layer (NBL) 22 in the substrate 14, a cathode region 12, an anode region 16 surrounding the cathode region 12, an n-type guard ring 18 surrounding the anode region 16 and connected to the NBL 22, and a p-type guard ring 20 surrounding the n-type guard ring 20.

A p-type buried layer (PBL) 24 is formed in the substrate 14 between the NBL 22, the cathode region 12, and the anode region 16, and also surrounded by the n-type guard ring 18. A HVPW 28 is also formed in the substrate 14 between the PBL 24, the cathode region 12, the anode region 16, and the n-type guard ring 18.

The cathode region 12 preferably includes a HV-PLDD 36 in the HVPW 28, an n-well 30 surrounding the HV-PLDD 36, and an n+ region 42 in the n-well 30 while surrounding the HV-PLDD 36. According to a preferred embodiment of the present invention, the HV-PLDD 36 is specifically formed for reducing on-resistance while keeping the active area of Schottky diode.

The anode region 16 includes a HV-PLDD 36 in the HVPW 28, and a p+ region 44 in the HV-PLDD 36.

Figure 3:
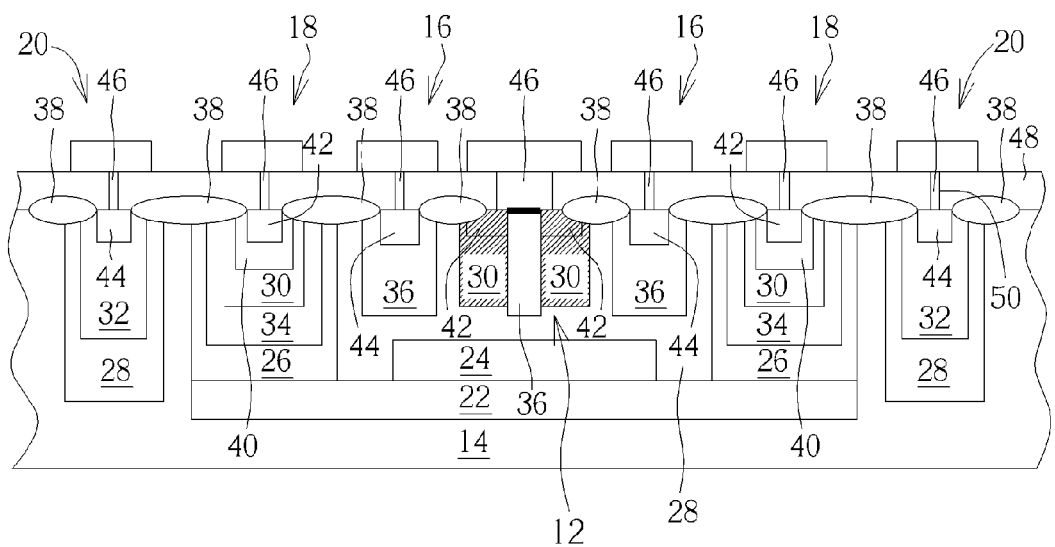
FIG. 3 illustrates a perspective view emphasizing the cathode region of the Schottky diode structure of the present invention.

As shown in FIG. 3, the cathode region 12 preferably includes a contact portion between the contact plug 46 and the HV-PLDD 36 in the HVPW 28, an n-well 30 surrounding the HV-PLDD 36, and an n+ region 42 in the n-well 30 while surrounding the HV-PLDD 36. According to a preferred embodiment of the present invention, the HV-PLDD 36 is specifically formed for reducing on-resistance while keeping the active area of Schottky diode.

Figure 4:
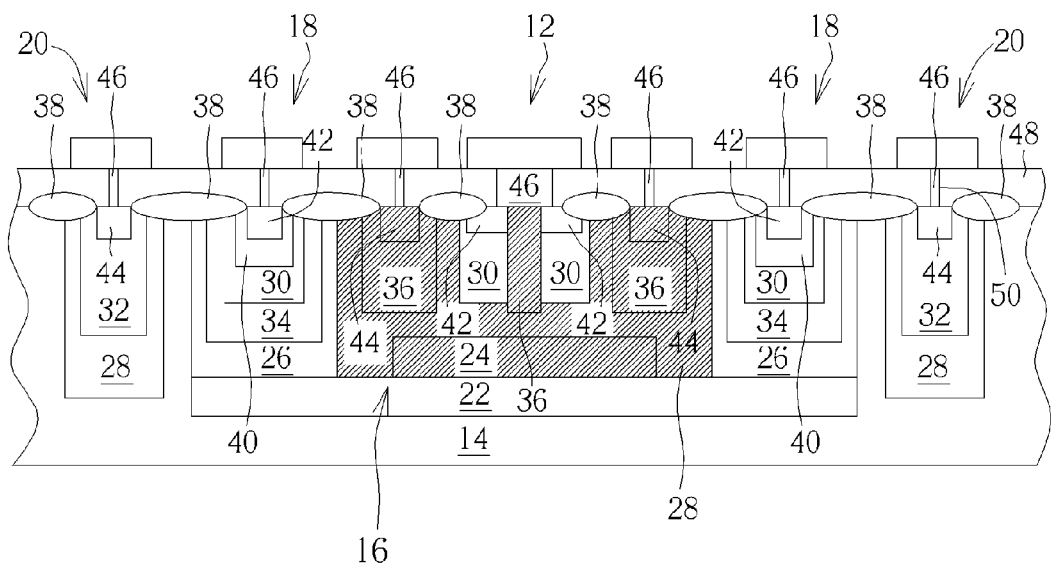
FIG. 4 illustrates a perspective view emphasizing the anode region of the Schottky diode structure of the present invention.

As shown in FIG. 4, the anode region 16 includes a HV-PLDD 36 in the HVPW 28, a p+ region 44 in the HV-PLDD 36 and the PBL 24.

Figure 5:
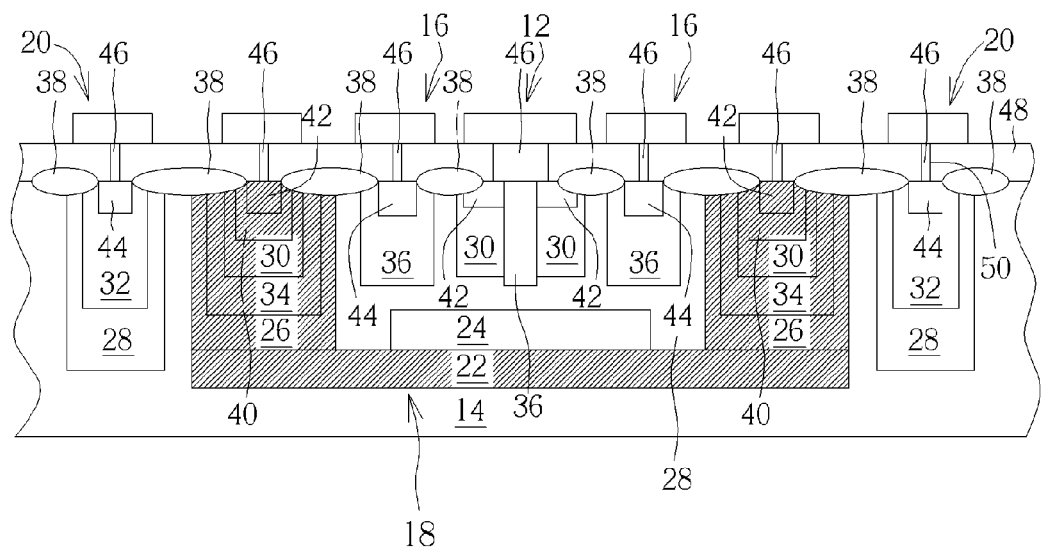
FIG. 5 illustrates a perspective view emphasizing the n-type guard ring of the Schottky diode structure of the present invention.

As shown in FIG. 5, the n-type guard ring 18 includes a HVDNW 26, a HV-NLDD 34 in the HVDNW 26, an n-well 30 in the HV-NLDD 34, an NLDD 40 in the n-well 30, an n+ region 42 in the NLDD 40 and the NBL 22.

Figure 6:
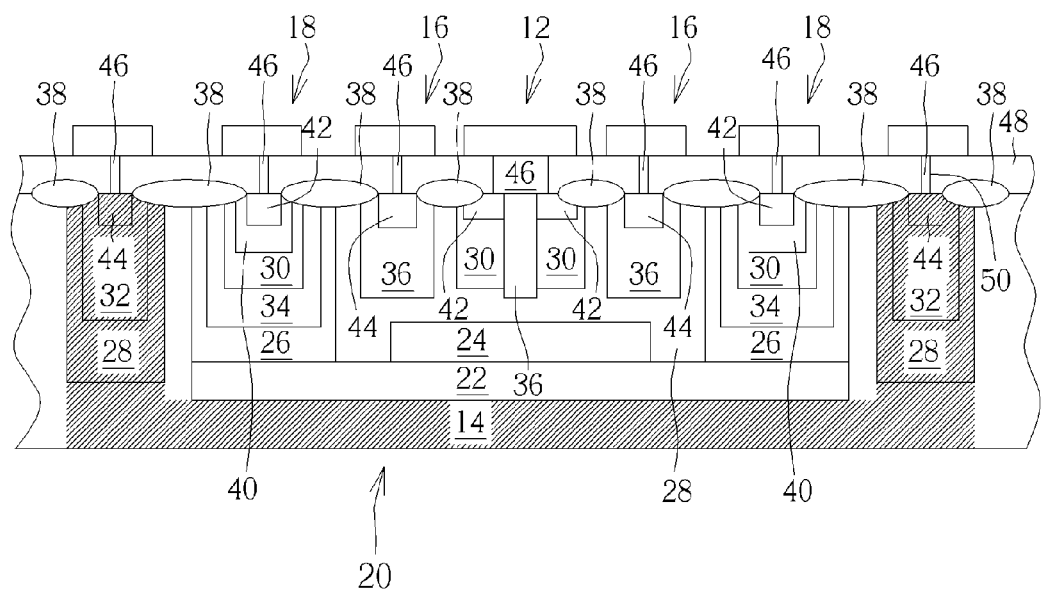
FIG. 6 illustrates a perspective view emphasizing the p-type guard ring of the Schottky diode structure of the present invention.

As shown in FIG. 6, the p-type guard ring 20 includes a HVPW 28 in the substrate 14, a p-well 32 in the HVPW 28, a p+ region 44 in the p-well 32 and the substrate 14.

By utilizing the design disclosed in the aforementioned embodiment, the present invention is able to provide a Schottky diode with two major benefits. First, the drawback such as high substrate current typically found in conventional Schottky diode is improved substantially as a result of the redesigned structure. Secondly, by using the contact plugs to directly contact the doping regions in the substrate for forming Schottky metal directly while eliminating the formation of salicide also reduces the overall cost of the fabrication substantially.

Figure 2:
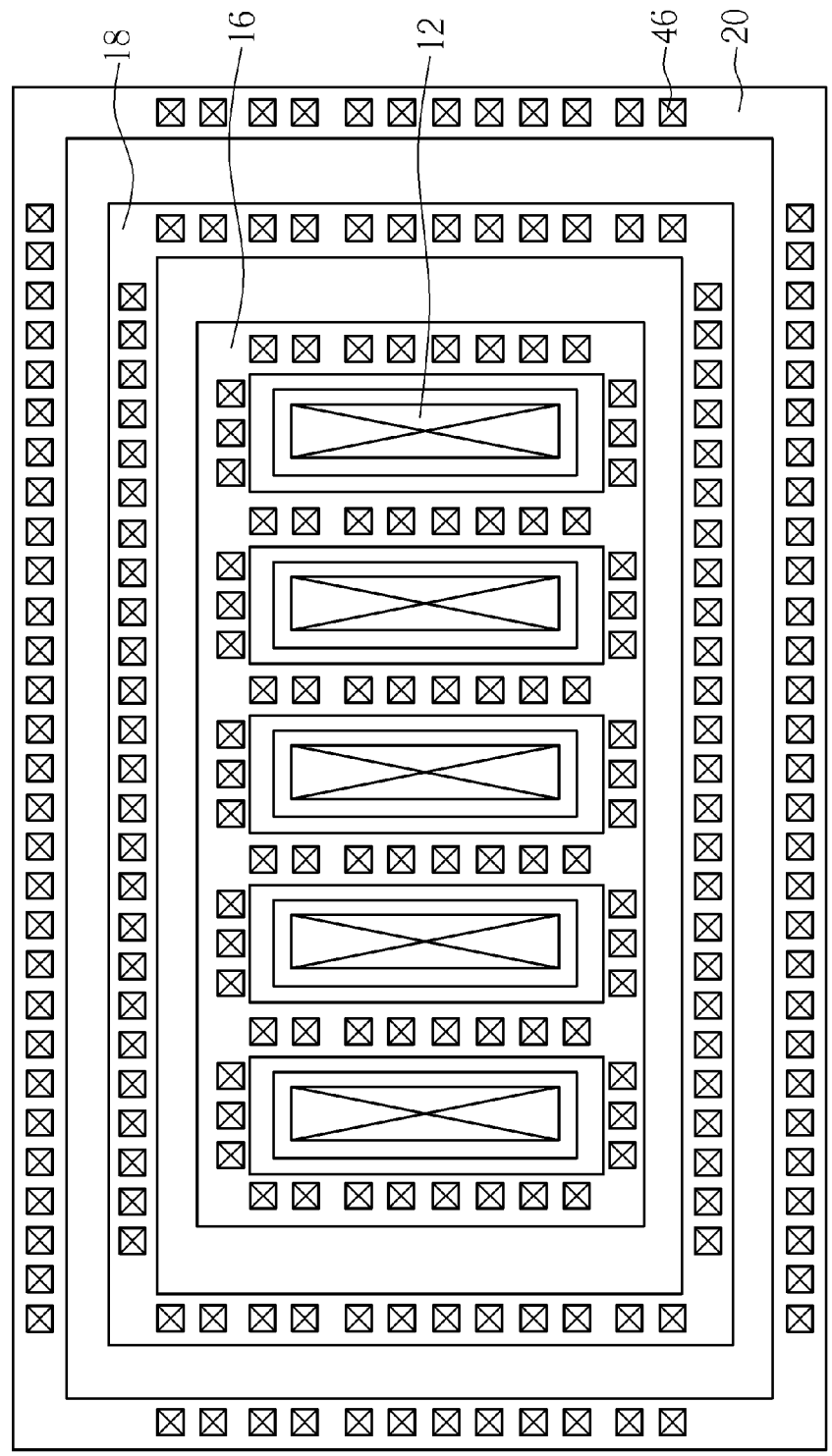
FIG. 2 illustrates a top view of a Schottky diode array according to an embodiment of the present invention.

In addition to the Schottky diode structure disclose above, a Schottky diode array is further disclosed according to an embodiment of the present invention. For instance, as shown in FIG. 2, the quantity of the cathode region 12 could be expanded to form a Schottky diode array for producing higher current output, which is also within the scope of the present invention. As shown in the figure, as only the quantity of cathode regions 12 are increased in this instance, all of the plurality of cathode regions 12 is preferably surrounded by a single anode region 16 while each of the cathode regions 12 is also surrounded by a plurality of contact plugs 46 formed in the anode region 16. Similar to the aforementioned embodiment, an n-type guard ring 18 and a p-type guard ring 20 are also formed outside the anode region 16 with plurality of contact plugs 46.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Schottky diode, comprising:
    a substrate;
    a first-type buried layer in the substrate;
    a cathode region, comprising:
        a high-voltage second-type lightly doped drain in the substrate;
        a first-type well surrounding the high-voltage second-type lightly doped drain; and
        a first-type doping region in the first-type well and surrounding the high-voltage second-type lightly doped drain;
    an anode region surrounding the cathode region; and
    a first-type guard ring surrounding the anode region and connected to the first-type buried layer.

2. The Schottky diode of claim 1, further comprising a second-type buried layer between the first-type buried layer and the cathode region.

3. The Schottky diode of claim 2, further comprising a high-voltage second-type well between the second-type buried layer, the first-type guard ring, the cathode region, and the anode region.

4. The Schottky diode of claim 1, wherein the anode region comprises:
    the high-voltage second-type lightly doped drain; and
    a second-type doping region in the high-voltage second-type lightly doped drain.

5. The Schottky diode of claim 1, wherein the first-type guard ring comprises:
    a high-voltage deep first-type well;
    a high-voltage first-type lightly doped drain in the high-voltage deep first-type well;
    the first-type well in the high-voltage first-type lightly doped drain;
    a first-type lightly doped drain in the first-type well; and
    the first-type doping region in the first-type lightly doped drain.

6. The Schottky diode of claim 1, further comprising a second-type guard ring surrounding the first-type guard ring, wherein the second-type guard ring comprises:
    a high-voltage second-type well;
    a second-type well in the high-voltage second-type well; and
    a second-type doping region in the second-type well.

7. The Schottky diode of claim 1, further comprising an isolation structure between the cathode region and the anode region, and between the anode region and the first-type guard ring.

8. The Schottky diode of claim 1, further comprising a contact plug directly contacting the high-voltage second-type lightly doped drain.

9. The Schottky diode of claim 8, wherein the contact plug comprises Ti and TiN.

10. The Schottky diode of claim 1, wherein the first-type is n-type and second-type is p-type.

11. A method for fabricating Schottky diode, comprising:
    providing a substrate;
    forming a first-type buried layer in the substrate;
    forming a first-type guard ring in the substrate, wherein the first-type guard ring contacts the first-type buried layer;
    forming a cathode region in the substrate, wherein the cathode region comprises:
        a high-voltage second-type lightly doped drain in the substrate;
        a first-type well surrounding the high-voltage second-type lightly doped drain; and
        a first-type doping region in the first-type well surrounding the high-voltage second-type lightly doped drain; and
    forming an anode region between the cathode region and the first-type guard ring.

12. The method of claim 11, further comprising forming a second-type buried layer between the first-type buried layer and the cathode region.

13. The method of claim 12, further comprising forming a high-voltage second-type well between the second-type buried layer, the first-type guard ring, the cathode region, and the anode region.

14. The method of claim 11, further comprising:
    forming a high-voltage deep first-type well;
    forming a high-voltage first-type lightly doped drain;
    forming the first-type well;
    forming a first-type lightly doped drain; and
    forming the first-type doping region for forming the first-type guard ring.

15. The method of claim 11, further comprising:
    forming the high-voltage second-type lightly doped drain; and
    forming a second-type doping region in the high-voltage second-type lightly doped drain for forming the anode region.

16. The method of claim 11, further comprising:
    forming a high-voltage second-type well in the substrate;
    forming a second-type well in the high-voltage second-type well; and
    forming a second-type doping region in the second-type well for forming a second-type guard ring surrounding the first-type guard ring.

17. The method of claim 11, further comprising:
    forming an isolation structure between the cathode region and the anode region, and between the anode region and the first-type guard ring.

18. The method of claim 11, further comprising:
    forming a dielectric layer on the substrate;
    forming an opening in the dielectric layer to expose the high-voltage second-type lightly doped drain;
    sputtering a first metal layer in the opening;

performing an anneal process;
depositing a second metal layer in the opening;
depositing a third metal layer in the opening; and
performing a planarizing process for forming a contact plug contacting the high-voltage second-type lightly doped drain.

19. The method of claim 18, wherein the first metal layer comprises Ti or TiN, the second metal layer comprises TiN, and the third metal layer comprises W.

20. The method of claim 11, wherein the first-type is n-type and the second-type is p-type.

* * * * *